United States Patent
Reid (10) Patent No.: US 10,747,916 B2
(45) Date of Patent: *Aug. 18, 2020

(54) PARAMETER GENERATION FOR MODELING OF PROCESS-INDUCED SEMICONDUCTOR DEVICE VARIATION (71) Applicant: Synopsys, Inc., Mountain View, CA (US)

(72) Inventor: David Thomas Reid, Glasgow (GB)

(73) Assignee: Synopsys, Inc., Mountain View, CA (US)

( * ) Notice: Subject to any disclaimer, the term of this patent is extended or adjusted under 35 U.S.C. 154(b) by 453 days.

This patent is subject to a terminal disclaimer.

(21) Appl. No.: 15/149,994

(22) Filed: May 9, 2016

(65) Prior Publication Data

US 2016/0378717 A1    Dec. 29, 2016

Related U.S. Application Data (60) Provisional application No. 62/186,120, filed on Jun. 29, 2015.

(51) Int. Cl.
*G06F 30/20* (2020.01)
*G06F 11/34* (2006.01)
*G06F 30/367* (2020.01)

(52) U.S. Cl.
CPC .......... *G06F 30/20* (2020.01); *G06F 11/3409* (2013.01); *G06F 30/367* (2020.01)

(58) Field of Classification Search
CPC ............. G06F 17/5009; G06F 11/3409; G06F 17/5036; G06F 30/20; G06F 30/367
See application file for complete search history.

(56) References Cited

U.S. PATENT DOCUMENTS

2008/0282217 A1* 11/2008 Takao ............. H01L 21/823412
                                                                716/50
2010/0269079 A1* 10/2010 Banerjee ............. G06F 17/5009
                                                                716/106
2013/0159974 A1*  6/2013 Norton ................ G06F 11/3684
                                                                717/124

OTHER PUBLICATIONS

Andre Lange, Christoph Sohrmann, Roland Jancke, Joachim Haase, Binjie Cheng, Urban Kovac, Asen Asenov; A General Approach for Multivariate Statistical MOSFET Compact Modeling Preserving Correlations; 2011; 4 pages (Year: 2011).*

(Continued)

*Primary Examiner* — Doon Y Chow
*Assistant Examiner* — Kimberly L Jordan
(74) *Attorney, Agent, or Firm* — Haynes Beffel & Wolfeld, LLP; Andrew L. Dunlap; Paul A. Durdik (57) ABSTRACT A method for generating semiconductor device model parameters includes receiving semiconductor device performance data of statistical instances of semiconductor devices, for a plurality of coordinates in a process space with dimensions of process-dependent device parameters Model parameters are extracted to produce individual model instances, each corresponding to the respective statistical instances for the coordinates in the process space. Statistics of the extracted model parameters are modeled by processing the individual model instances to determine, for each coordinate in the process space, moments describing non-normal marginal distributions of the extracted model parameters and correlations between the extracted model parameters. Semiconductor device model parameters are generated for use in simulating a circuit using the determined moments and the determined correlations, for a selected coordinate in the process space.

17 Claims, 7 Drawing Sheets

(56) References Cited

OTHER PUBLICATIONS

Cheng, et al. "Statistical-Variability Compact-Modeling Strategies for BSIM4 and PSP" IEEE Design & Test of Computers 271.2 , Mar./Apr. 2010, pp. 26-35.
Freimer et al., "A Study of the Generalized Tukey Lambda Family," Communications in Statistics—Theory and Methods vol. 17 , Iss. 10, 1988, pp. 3547-3567.
U.S. Appl. No. 15/149,977—Office Action dated Sep. 19, 2018, 22 pages.
Bukhori et al., "Simulation of Statistical Aspects of Charge Trapping and Related Degradation in Bulk MOSFETs in the Presence of Random Discrete Dopants," IEEE Transactions on Electron Devices, Apr. 4, 2010, 9 pages.
U.S. Appl. No. 15/150,009—Office Action dated Sep. 21, 2018, 20 pages.
Asenov et al., "Predictive Simulation of Future CMOS Technologies and Their Impact on Circuits," IEEE, Oct. 1, 2014, 4 pages.

\* cited by examiner

PARAMETER GENERATION FOR MODELING OF PROCESS-INDUCED SEMICONDUCTOR DEVICE VARIATION

CROSS REFERENCE TO RELATED APPLICATIONS

The present invention claims priority to U.S. Provisional Application No. 62/186,120, entitled "Parameter Generation for Modeling of Process-Induced Semiconductor Device Variation" and filed on Jun. 29, 2015, the entirety of which is being incorporated by reference herein. The present application may also be related to U.S. patent application Ser. No. 15/149,977, entitled "Parameter Generation for Semiconductor Device Trapped-Charge Modeling" and filed on May 9, 2016, which, in turn, claims priority to U.S. Provisional Application No. 62/163,924, entitled "Parameter Generation for Semiconductor Device Trapped-Charge Modeling" and filed on May 19, 2015, the entirety of both of which is being incorporated by reference herein. The present application may also be related to U.S. patent application Ser. No. 15/150,009, entitled "Semiconductor Device Simulation" and filed on May 9, 2016, which, in turn, claims priority to U.S. Provisional Application No. 62/239,235, entitled "Semiconductor Device Simulation" and filed on Oct. 8, 2015, the entirety of both of which is being incorporated by reference herein.

TECHNICAL FIELD

The present invention is generally in the field of semiconductors. More particularly, the invention is in the field of semiconductor device modeling and in particular methods and systems of generating semiconductor device model parameters for modeling process-induced device variations. The invention also relates to associated non-transitory computer-readable media and computer-readable media containing program code. The invention also relates to an associated method of manufacturing integrated circuits and the integrated circuits thus manufactured.

BACKGROUND ART

Semiconductor device models, such as transistor models, are vital in achieving reliable performance from circuit designs using semiconductor devices. Moreover, semiconductor device models can significantly increase the efficiency of the circuit design process.

Compact transistor models such as BSIM4 (Berkeley Short-channel IGFET Model 4) and BSIM-CMG (Berkeley Short-channel IGFET Model—Common Multi-Gate) are simplified physical models typically employed in circuit simulators, for example SPICE (Simulation Program with Integrated Circuit Emphasis), to model the behavior of semiconductor devices such as CMOS (Complementary Metal-Oxide-Semiconductor) field effect transistors in integrated circuits. The set of parameters that specify the behavior of a particular semiconductor device are stored in a data structure called a model card, which is used as an input to a SPICE simulation process.

However, it is a problem that known approaches do not accurately model process-induced variation of semiconductor devices.

SUMMARY

A method for generating semiconductor device model parameters, substantially as shown in and/or described in connection with at least one of the figures, and as set forth more completely in the claims.

According to a first aspect of the present invention, there is provided a method for execution in at least one processor of at least one computer, the method for generating semiconductor device model parameters, the method comprising the steps of:
(a) receiving semiconductor device performance data of a plurality of statistical instances of semiconductor devices, for a plurality of coordinates in process space, wherein at least some of the semiconductor device performance data is obtained, at least in part, from a data set acquired by measurement;
(b) extracting model parameters from the semiconductor device performance data to produce a plurality of individual model instances each corresponding to the respective statistical instances for the plurality of coordinates in process space;
(c) modeling statistics of the extracted model parameters by processing the individual model instances to determine, for each coordinate in process space:
moments describing non-normal marginal distributions of the extracted model parameters; and
correlations between the extracted model parameters; and
(d) generating semiconductor device model parameters using the determined moments and the determined correlations, for a selected coordinate in process space.

Preferably, the process space has dimensions of one or more process-dependent device parameters.

Preferably, differences between the statistical instances relate to different modelled configurations of device geometry, which affect semiconductor device performance.

Preferably, the step (a) of receiving semiconductor device performance data further comprises obtaining uniform semiconductor device performance data of a uniform semiconductor device that is a basis around which variations occur, and the step (b) of extracting model parameters comprises extracting from the uniform semiconductor device performance data a set of uniform model parameters and using the uniform model parameters to re-extract from the semiconductor device performance data a subset of the uniform model parameters for each of the statistical instances, the subset model parameters being selected to capture process-induced variability of semiconductor device performance that arises from variation of the semiconductor device.

Preferably, the step (c) of modeling statistics comprises using response surface modeling to calculate moments and correlations at intermediate process-dependent device parameters.

Preferably, the step (c) of modeling statistics further comprises calculating Generalized Lambda Distribution (GLD) parameters to fit the moments by fitting each determined marginal distribution to a Generalized Lambda Distribution (GLD) using the method of moments.

Preferably, the step (d) of generating model parameters comprises generating multivariate Gaussian variates and applying a Probability Integral Transform to obtain a random sample of variates as the semiconductor device model parameters.

According to a second aspect of the present invention, there is provided a non-transitory computer-readable medium containing program code, the program code adapted to configure the at least one processor of the at least one computer to execute the method of the first aspect.

According to a third aspect of the present invention, there is provided a computer-readable medium containing program code, the program code adapted to configure the at least one processor of the at least one computer to execute the method of the first aspect, the computer-readable medium being selected from the group consisting of a compact disk (CD), a digital video disk (DVD), a flash memory storage device, a hard disk, a random access memory (RAM), and a read only memory (ROM).

According to a fourth aspect of the present invention, there is provided a system for generating semiconductor device model parameters, the system obtaining a set of measured data from a substrate under test, the substrate under test including a physical semiconductor device, the set of measured data being utilized by at least one processor of at least one computer of the system to implement a method for generating semiconductor device model parameters, the computer configured to perform the steps of:

(a) receiving semiconductor device performance data of a plurality of statistical instances of semiconductor devices, for a plurality of coordinates in process space;

(b) extracting model parameters from the semiconductor device performance data to produce a plurality of individual model instances each corresponding to the respective statistical instances for the plurality of coordinates in process space;

(c) modeling by computer statistics of the extracted model parameters by processing the individual model instances to determine, for each coordinate in process space:

moments describing non-normal marginal distributions of the extracted model parameters; and correlations between the extracted model parameters; and (d) generating semiconductor device model parameters using the determined moments and the determined correlations, for a selected coordinate in process space.

According to a fifth aspect of the present invention, there is provided a method of manufacturing integrated circuits, the method comprising the steps of:

(a) receiving semiconductor device performance data of a plurality of statistical instances of semiconductor devices, for a plurality of coordinates in process space, wherein at least some of the semiconductor device performance data is obtained, at least in part, from a data set acquired by measurement;

(b) extracting model parameters from the semiconductor device performance data to produce a plurality of individual model instances each corresponding to the respective statistical instances for the plurality of coordinates in process space;

(c) modeling statistics of the extracted model parameters by processing the individual model instances to determine, for each coordinate in process space:

moments describing non-normal marginal distributions of the extracted model parameters and correlations between the extracted model parameters;

(d) generating semiconductor device model parameters using the determined moments and the determined correlations, for a selected coordinate in process space;

(e) using the generated semiconductor device model parameters to generate a circuit layout; and (f) using the circuit layout to pattern a semiconductor substrate to produce an integrated circuit.

According to a sixth aspect of the present invention, there is provided an integrated circuit manufactured using the method of the fifth aspect.

BRIEF DESCRIPTION OF THE DRAWINGS

Embodiments of the present invention will now be described, by way of example only, with reference to the drawings, in which.

DETAILED DESCRIPTION OF EMBODIMENTS

The present invention is directed to a method of generating semiconductor device model parameters. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
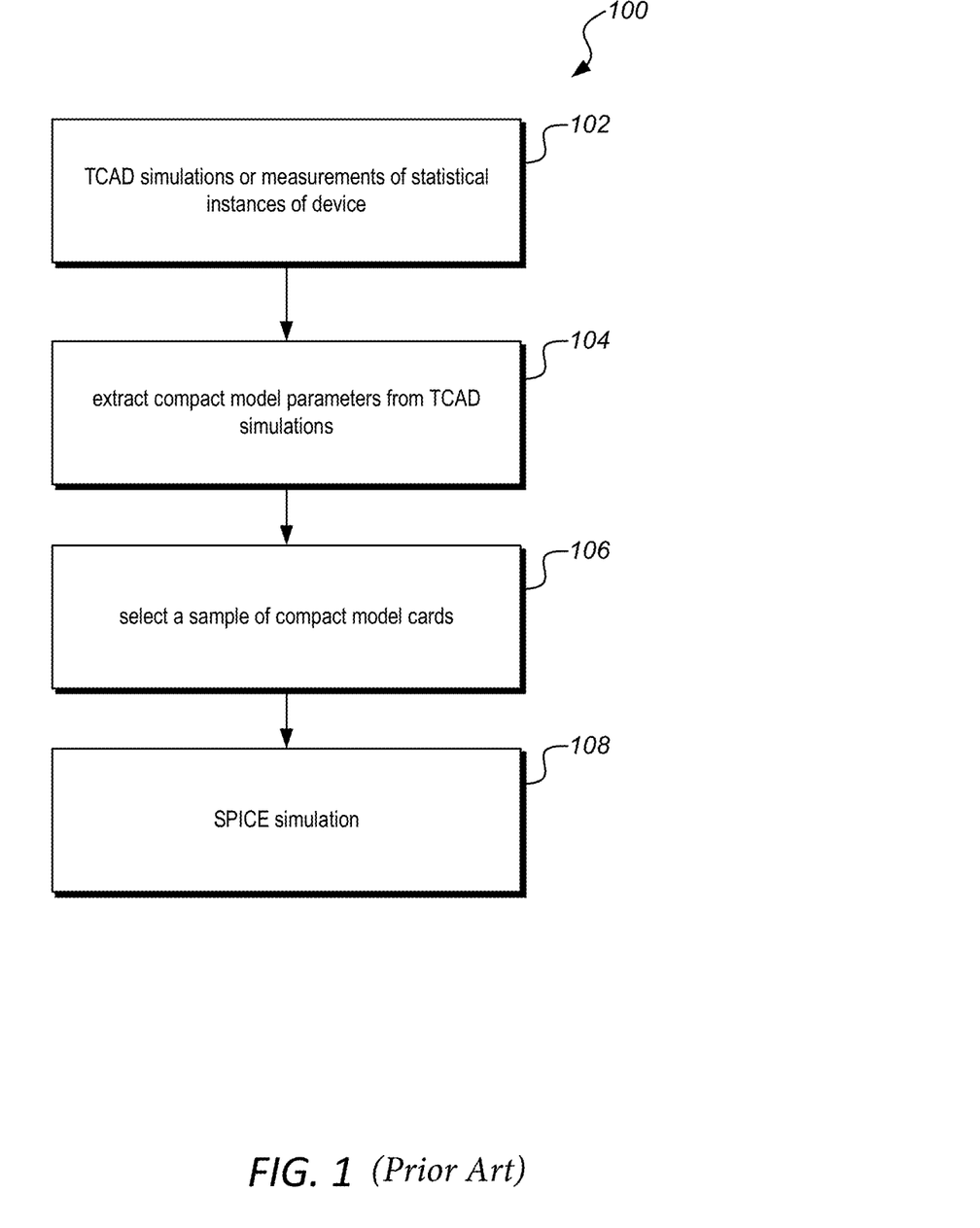
FIG. 1 shows a flowchart illustrating typical steps taken to implement a conventional method.

With reference to FIG. 1, a flowchart 100 illustrates typical steps taken to implement a conventional method. At step 102, TCAD simulations of, for example, a thousand statistical instances of a semiconductor device are performed. The differences between the statistical instances relate to different modelled configurations of random variability sources which affect semiconductor device performance, such as RDD, LER and MGG. At step 104, compact model parameters are extracted from the results of the TCAD simulations and stored as a thousand model cards. At step 106, a sample of six of the compact model cards are selected and used for SPICE simulation at step 108.

Figure 2:
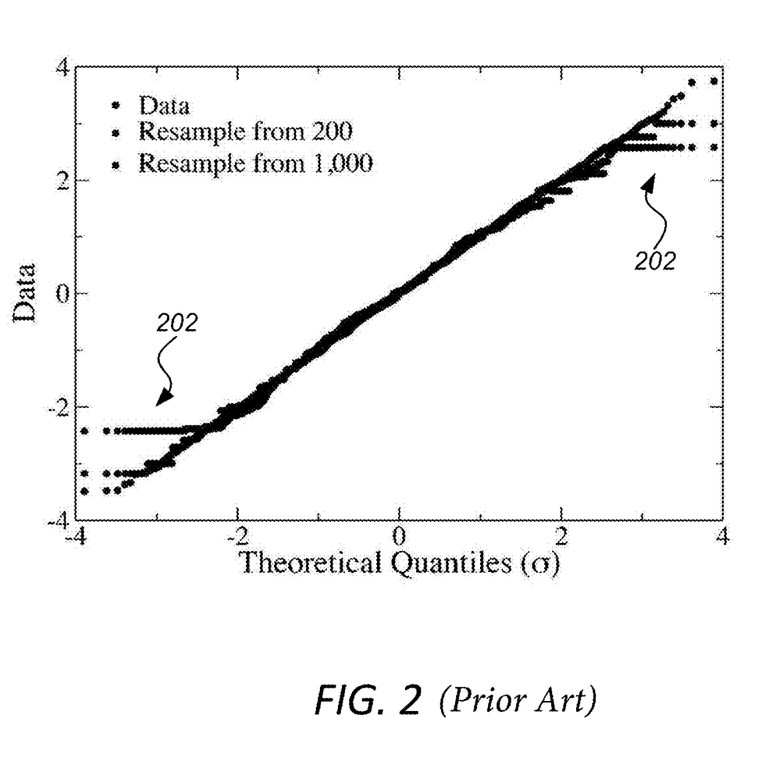
FIG. 2 shows a quantile-quantile plot illustrating a problem arising from the conventional method.

FIG. 2, which shows a quantile-quantile plot, illustrates the problem of using TCAD extracted models directly according to the conventional method of FIG. 1. This is example data, generated from a standard normal distribution and then resampled to specifically illustrate the subsampling problem. In this example 6 model cards are sampled from $n_s=200$ and $n_s=1000$ simulations, in order to represent a 6T (6-transistor) cell. Repeated sampling of limited numbers of models leads to statistical artefacts in the tails 202. This makes it unfeasible to model accurately the effects of random variability sources along with process-induced variation due to processing of the semiconductor device. This can be avoided by generating models in a way that duplicates the statistics of the model parameters, as described below.

In the present disclosure, we define:

1. A set of compact model parameters S, of size $n_p$.

2. A statistical sample size $n_s$.
3. (a) A set of m process-dependent device parameters, for example device geometric parameters such as gate Length L and width W, each having n values of the respective process-dependent device parameter. A process-dependent device parameter is any parameter that has systematic variations due to processing of the semiconductor device. The set size may be m=1, m=2, m=3, etc. One or more device parameters may map onto SPICE parameters. In other embodiments, one or more parameters may not map onto SPICE parameters. (b) A Design of Experiments (DoE) space, or process space, with dimensions of one or more process-dependent device parameters. When m>1, each coordinate in the process space is a combination of process-dependent device parameters that may be defined by the Cartesian product of the process-dependent device parameters. The coordinates in process space are then m-tuples in the Cartesian product of a plurality of m process-dependent device parameters. The process space thus contains a set of coordinates, of size $n^m$. In some embodiments, different process-dependent device parameters may have different respective numbers of values, such that the total number of coordinates is not simply $n^m$. In other embodiments of the present invention a subset of the Cartesian coordinates may be used, for example to save the processing cost by not performing simulations at points away from the axes in the space, which are unlikely to represent real devices. The choice of points may depend on how the parameters were correlated, in which case points away from the axes could be included as representative of real devices. Although a Cartesian product is a convenient way to combine the process-dependent device parameters, other types of combination may be used. Each coordinate is a point in the process space. The process space thus has dimensions of one or more process-dependent device parameters. When a process-dependent device parameter is a device geometric parameter, it represents the extent in physical space of aspects of the semiconductor device. The coordinates in process space may be used to describe the effect of process variations on the compact model parameters.

Examples of device geometric parameters from BSIM4 are: L—Gate length W—Gate width, EOT—Equivalent oxide thickness, XJ—Junction depth, LINT/WINT—L/W offset parameters and XL/XW—Layout dependent L/W offset parameters.

There are also a set of other parameters used in the effective gate length/width calculations. Although it is possible to use these parameters, they are less useful because they relate to second or third order effects.

In model of a FinFET device architecture (e.g. BSIM-CMG), the above device geometric parameters could be complemented by HFIN (fin height), TFIN (fin thickness) and FPITCH (fin pitch).

An example of a process-dependent device parameter that is not a device geometric parameter is one which depends on implant dose and/or thermal treatment. Another example is a parameter which depends on how amorphous the gate stack is, which may depend on thermal processing conditions. $V_{TH0}$ may be used as a process-dependent device parameter, either alone or in combination with other process-dependent device parameter.

Figure 3:
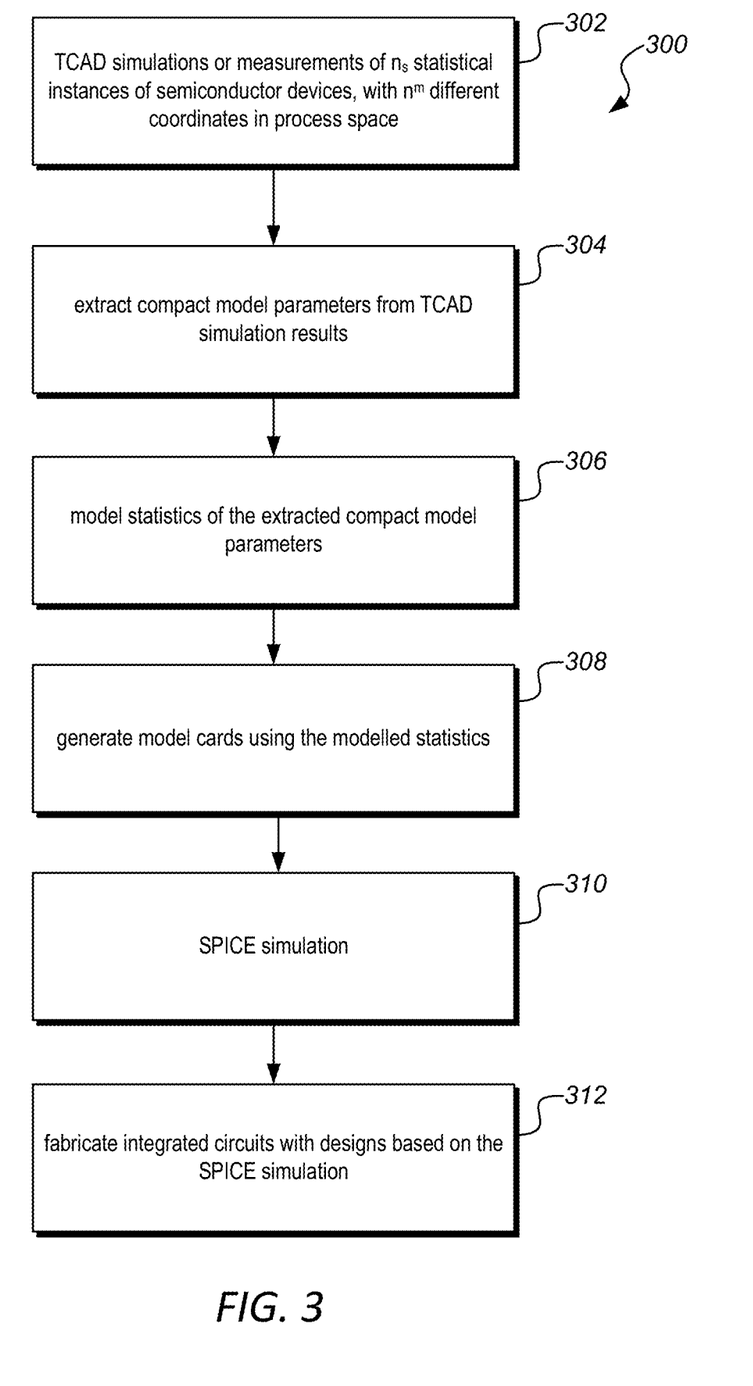
FIG. 3 shows a flowchart illustrating the steps taken to implement an embodiment of the present invention.

FIG. 3 shows a flowchart illustrating the steps taken to implement an embodiment of the present invention for generating semiconductor device model parameters and subsequently fabricating integrated circuits.

Figure 4:
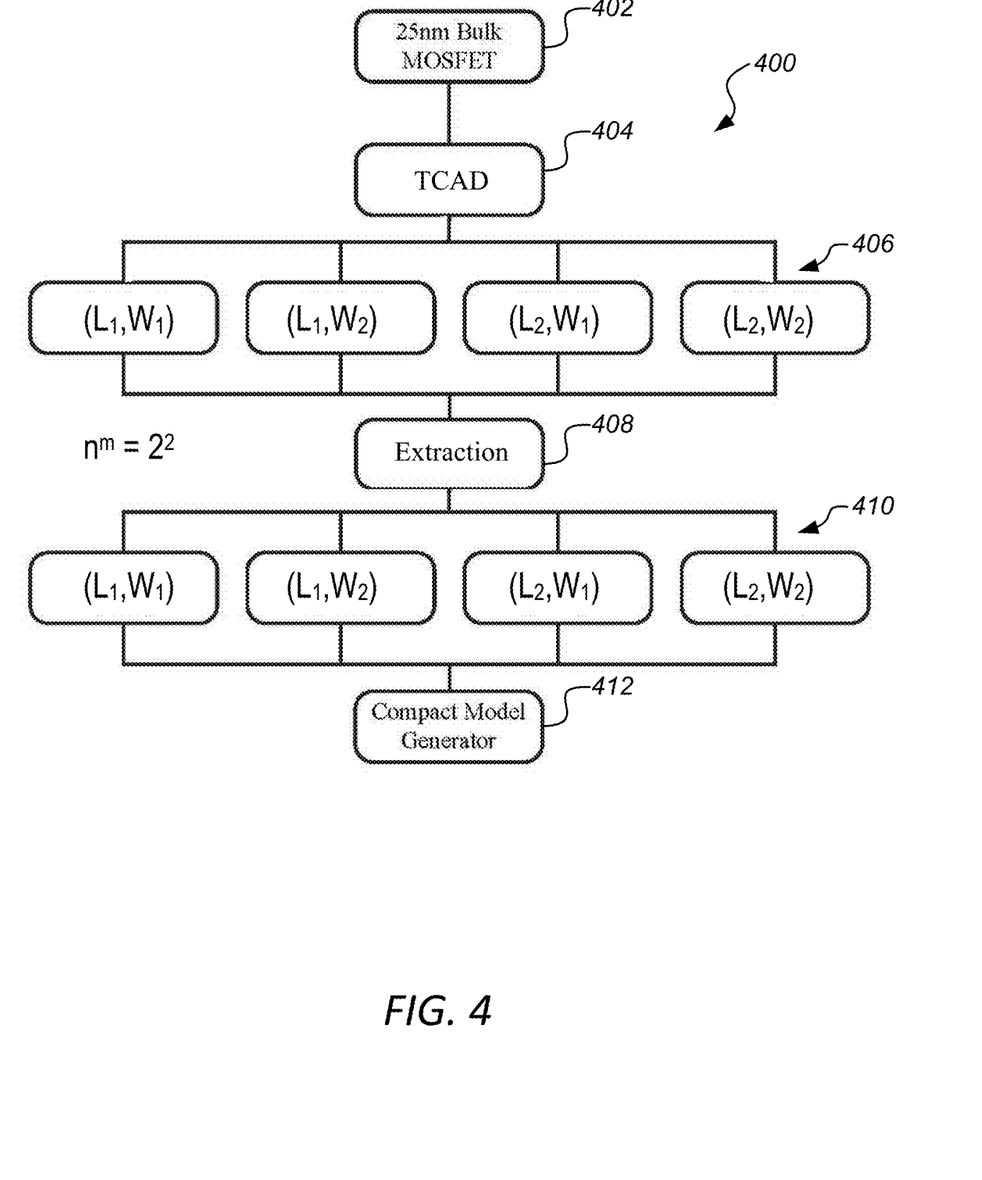
FIG. 4 shows the flow of data from physical TCAD simulations via compact models through to a compact model generator.

At step 302, TCAD simulations of a plurality ($n_s$=1000) of statistical instances of semiconductor devices are performed for a plurality of coordinates in process space, to produce simulation results (406 in FIG. 4). The TCAD simulation model is calibrated by acquiring a data set by measurements on physical semiconductor devices and fitting the TCAD parameters to the measured data set. When obtaining the semiconductor device performance data by simulation, the statistical instances may include a uniform semiconductor device that is the basis around which variations occur. The differences between the statistical instances for a given coordinate in process space relate to different modelled configurations of random variability sources, which affect semiconductor device performance. The random variability sources may comprise at least one of RDD, LER and gate granularity.

Another way of obtaining suitable semiconductor device performance data is to measure statistical instances of actual physical semiconductor devices. The differences between the statistical instances for a given coordinate in process space then relate to different actual physical configurations of random variability sources, which affect semiconductor device performance. The random variability sources may comprise at least one of RDD, LER and gate granularity. Uniform semiconductor device performance data may be obtained by selecting a "golden" measured device, which may be close to the average or median performance. Uniform semiconductor device performance data may also be obtained by taking, for example, the average performance data of a cohort of measured semiconductor devices. When obtaining the semiconductor device performance data by measurement, the uniform semiconductor device is a basis around which variations occur.

The TCAD simulation results or measurement results thus obtained are received by the computer on which extraction and parameter generation are performed. In both cases, at least some of the semiconductor device performance data is obtained, at least in part, from a data set acquired by measurement. The data set may comprise current-voltage (IV) characteristics obtained by measurements of test structures or process control monitors (PCM). Such test structures may also be subjected to electrical and thermal stress in order to determine the performance characteristics under the influence of process-induced device variations.

At step 304, compact model parameters are extracted from the semiconductor device performance data (TCAD simulation results or physical device measurement results) to produce a plurality ($n_s*n^m$) of individual model instances (410 in FIG. 4) each corresponding to the respective statistical instances (406 in FIG. 4) for the plurality of coordinates in process space.

At step 304, a set of uniform model parameters relating to the uniform semiconductor device are extracted from the semiconductor device performance data (simulation or measurement results) with no variations. The uniform model parameters are used to re-extract from the semiconductor device performance data a subset ($n_p$) of the uniform model parameters for each of the statistical instances. The subset of model parameters are selected to capture intrinsic statistical variability of semiconductor device performance. The variability arises from intrinsic parameter fluctuations due to configurations of random variability sources that affect semiconductor device performance. The random variability sources may comprise at least one of RDD, LER and poly or metal gate granularity. Statistical variability of semiconductor device performance also arises from process-induced device variations.

At step 306, statistics of the extracted compact model parameters are modeled by processing the individual model instances to determine, for each coordinate in process space: moments describing non-normal marginal distributions of the extracted compact model parameters; and correlations between the extracted compact model parameters. Response surface modeling may be used to calculate moments and correlations at selected combinations of intermediate process-dependent device parameters. Generalized Lambda Distribution (GLD) parameters may be calculated to fit the interpolated moments by fitting each determined marginal distribution to a Generalized Lambda Distribution (GLD) using the method of moments. FMKL (Freimer, Mudholkar, Kollia, and Lin, "A study of the generalized Tukey lambda family", Communications in Statistics—Theory and Methods, Volume 17, Issue 10, 1988) parameterization may be used for the fitting.

At step 308, compact model parameters for SPICE model cards are obtained by generating multivariate Gaussian variates and using the determined moments and correlations, for a selected coordinate in process space. This step may also include applying a Probability Integral Transform to obtain a random sample of variates. The correct moments are attained via the Probability Integral Transform; at the multivariate Gaussian generation stage, the numbers are standard normal.

At step 310, SPICE simulation is performed and finally in step 312, integrated circuits are fabricated with designs based on the SPICE simulation of step 310.

FIG. 4 shows the flow 400 of data from physical TCAD simulations via compact models through to a compact model generator. In this example, at 25 nm gate-length bulk MOSFET 402 is simulated in a TCAD simulator 404 to produce simulation results 406, as described in step 302 of FIG. 3. In this example, there are two device geometric parameters, gate length L and width W, therefore m=2. For each device geometric parameter there are two values, therefore n=2. Thus there are a total of $n^m=2^2=4$ sets of simulation results $\{(L_1, W_1), \ldots (L_2, W_2)\}$. Extraction software 408 performs the step 304 of FIG. 3 to extract parameters for the model cards 410 from the TCAD simulation results 406. These model cards 410 are input to a compact model generator 412, which performs the steps 306 and 308 of FIG. 3.

Figure 5:
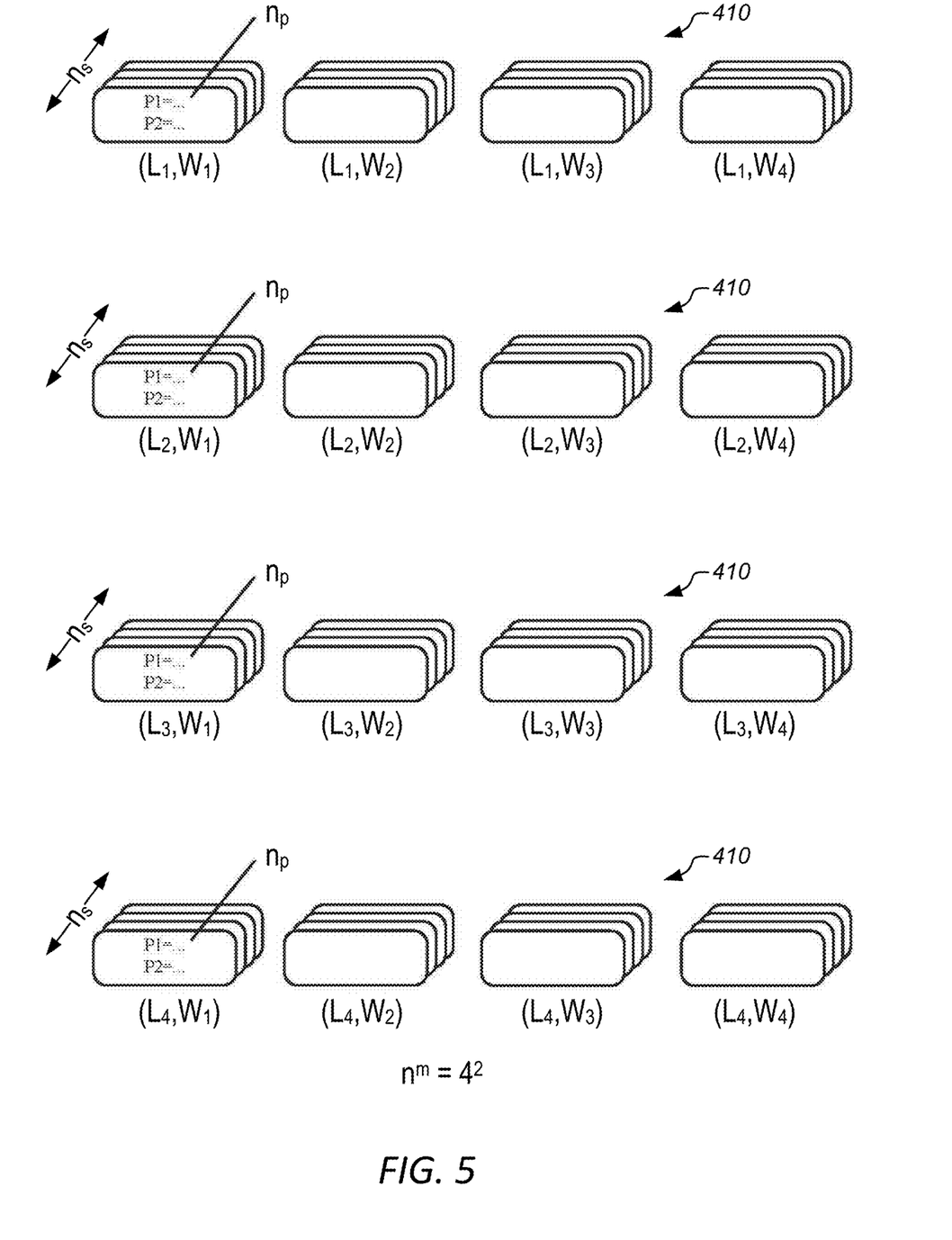
FIG. 5 shows the input data for the generation process.

FIG. 5 shows the input data 410 used for the generation process performed by compact model generator 412 of FIG. 4 in more detail. In this example, there are two device geometric parameters, gate length L and width W, therefore m=2. For each device geometric parameter there are four values identified by the subscripts 1 . . . 4, therefore n=4. Thus there are a total of $n^m=4^2=16$ sets of simulation results. At each of the plurality ($n^m=16$) of coordinates in process space, $\{(L_1, W_1), (L_1, W_2), \ldots (L_4, W_4)\}$, there are $n_s$ model cards, each with $n_p$ parameters (P1, P2, etc.).

Figure 6:
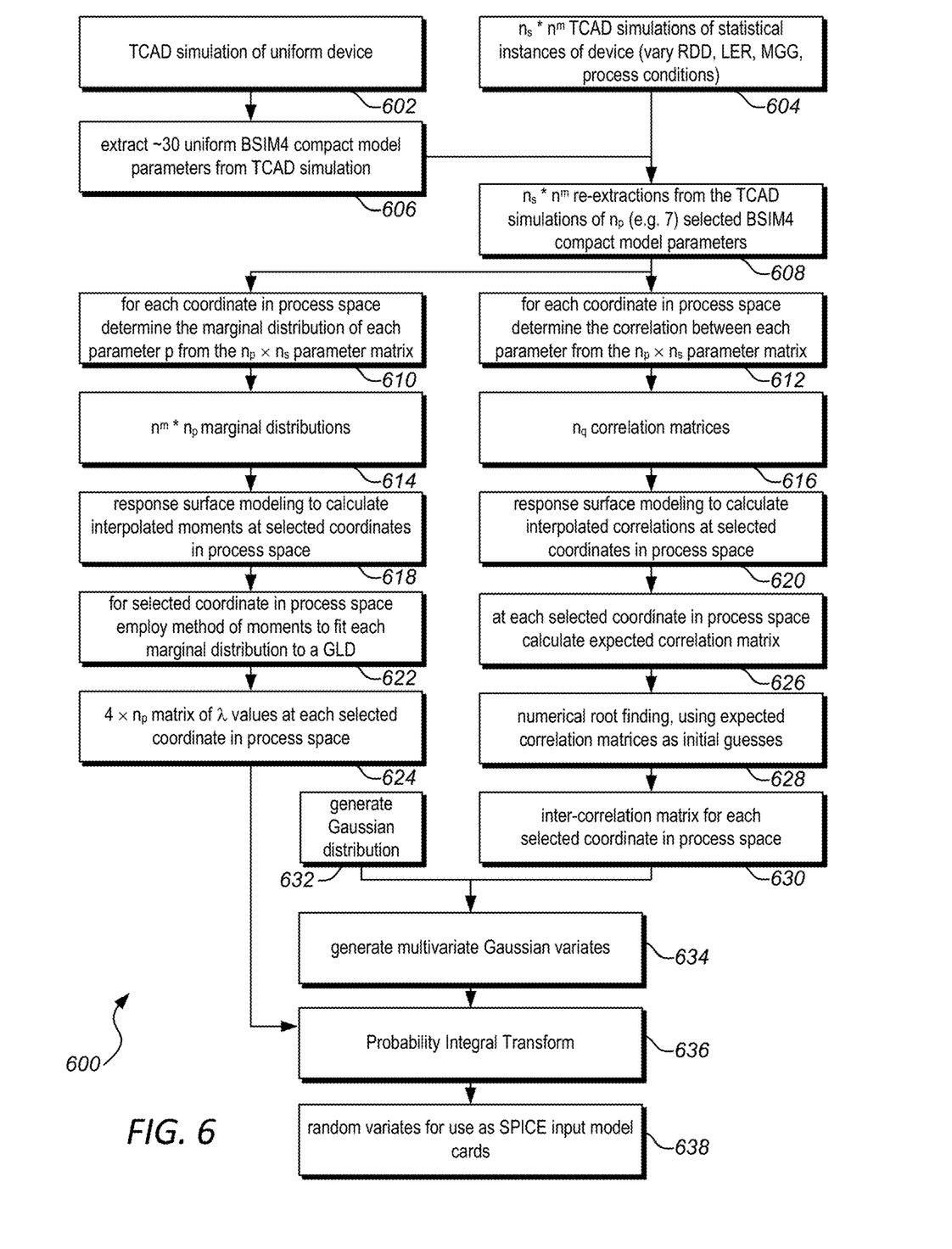
FIG. 6 shows a flowchart illustrating detailed steps taken to implement an embodiment of the present invention.

FIG. 6 shows a flowchart illustrating detailed steps taken to implement an embodiment of the present invention.

At step 602, TCAD simulation of a "uniform" device is performed.

At step 604, TCAD simulations of a plurality ($n_s$) of statistical instances of semiconductor devices are performed for a plurality ($n^m$) of coordinates in process space (i.e. points in the process space for different process conditions), to produce simulation results. The differences between the statistical instances for a given coordinate in process space relate to different modelled configurations of random variability sources, which affect semiconductor device performance. The random variability sources may comprise at least one of RDD, LER and MGG.

A two-stage direct statistical compact model (CM) extraction procedure is applied without making any prior assumptions about parameter distribution, correlation, or sensitivity.

In the first stage 606, a group-extraction and local-optimization strategy for BSIM4 is used to obtain the complete set of BSIM4 parameters for the uniform device. The resulting CM card serves as the base model card for the second-stage statistical extraction 608.

Thus at step 606 a "uniform" compact model is extracted following the process described in "Statistical-Variability Compact-Modeling Strategies for BSIM4 and PSP", Binjie Cheng et al, IEEE Design & Test of Computers 2010, vol. 27, Issue No. 02, March/April, pp: 26-35. This represents the idealized version of the transistor being modeled.

Furthermore, the "uniform" model can be extended with a set of process-dependent device parameters, e.g. device geometric parameters, that are a function of the process variables, e.g. gate length and width, which capture the process-induced variations in the compact model. Other process-dependent device parameters may not be physically geometric, but they may respond to geometric changes.

At step 608, a small subset S (e.g. $n_p=7$) of the 'uniform' model parameters are re-extracted in order to model statistical variations in transistor performance. These variations arise from intrinsic parameter fluctuations due to random variability sources such as random discrete dopants RDD, line edge roughness LER and metal gate granularity MGG. The statistical (i.e. local) variations are themselves dependent on the process-dependent device parameters.

On the basis of the physical analysis of the intrinsic statistical variability impact on device operation, for this example seven statistical parameters were used to capture the intrinsic statistical variability, although other numbers and combinations of suitable parameters may be used. For BSIM4, $V_{TH0}$ is the basic long-channel threshold-voltage parameter, and it accounts for the traditional threshold variation introduced by statistical variability. $U_0$ is the low-field mobility parameter and it accounts for the current-factor variation caused by statistical variability. $N_{factor}$ and $V_{OFF}$ are basic subthreshold parameters, accounting for subthreshold slope and off current variation. $M_{inv}$ is the moderate-inversion parameter, accounting for variation in the moderate inversion regime. $R_{dsw}$ is the basic source/drain resistance parameter, and it accounts for dopant variation in the source/drain. $D_{sub}$ is the drain-induced barrier lowering (DIBL) parameter, and it accounts for statistical variability induced DIBL variation.

The strategy yields an individual model instance corresponding to one microscopic configuration of the transistor, e.g. the particular positions of random dopants, shape of gate edges and grain patterns.

Simulations of "uniform" transistors are carried out at each of n values of the process-dependent device parameter, for each of the m process-dependent device parameters, yielding a set of $n^m$ points in m-dimensional space describing the effect of process variations on the compact model parameters. Intermediate points in such process space can be determined by fitting a response surface model to the simulated data.

By applying the above statistical extraction strategy to each of $n_s$ transistors simulated at each of $n^m$ coordinates in process space (process points), $n_s*n^m$ individual model instances are obtained, each with $n_p$ model parameters. This provides an $n_p \times n_s \times n^m$ 3-D matrix that characterizes the response of the subject transistor to time-dependent degradation. In concert with the generation strategy outlined below, the response surface model is used to determine the statistical parameters for the local mismatch at a given process point.

While the obtained model parameters can be used directly in circuit simulations, the finite sample size $n_s$ limits the resolution of the output variables, particularly in the tails of the statistical distributions, as discussed above with reference to FIG. 2. This is particularly problematic in advanced VLSI technologies as it precisely the rare events that determine the worst case performance and in turn the functional yield.

The present example overcomes this limitation by first modeling the statistics of the extracted model parameters and then using these as inputs to a generation process. The generation process allows new variates to be obtained that are in effect "statistically equal" to the inputs.

The data required for the generation process are obtained as follows with reference to steps 610 to 630.

At step 610, for each fixed coordinate in process space (e.g. each value of process-dependent device parameter, each combination of process-dependent device parameters or each process geometry), we can obtain an $n_p \times n_s$ matrix from which we can determine the marginal distribution of each model parameter, and at step 612, the correlation between each model parameter. In general, the marginal distributions need not be normally distributed, and the present example particularly addresses marginal distributions with arbitrary shape. Given the marginal and correlation matrix for a fixed coordinate in process space, we then have a complete description of the multivariate density function for the coordinate in process space.

The data then comprise $n^m * n_p$ marginal distributions 614 and $n^m$ correlation matrices 616, stored in computer memory. Each marginal distribution is characterized by four statistical moments: the mean, the variance, the skewness and the kurtosis. Given a sufficiently large sample size $n_s$, these statistics are taken as fully sufficient to characterize the distributions of model parameters arising from time-dependent degradation.

The multivariate density function can be determined for each coordinate in process space. Such an approach accurately reproduces the input data, however it is limited in that only variates for the initially selected coordinates in process space can be generated. The approach may be generalized to include data that are not part of the input dataset by employing a response surface modeling scheme for the moments of the marginal distributions. For this example, the marginal distribution moments are assumed to depend on the process geometry in a polynomial way, however this need not be the case and the embodiments of the present invention may use any suitable interpolation scheme that can describe the relationship between the moments and the process geometry.

At step 618, response surface modeling is used to calculate interpolated moments at desired coordinates in process space (e.g. selected process geometries), some or all of which are interpolated. The desired coordinates can be selected by the user and specified in the SPICE netlist. Alternatively, the coordinates may be selected using a statistical distribution obtained by measurement or simulation. Similarly, at step 620, response surface modeling is used to calculate interpolated correlations at the selected process geometries. A response surface modeling scheme is optional but has been shown to reproduce a) the compact model parameter statistics and b) the transistor performance statistics of independently simulated samples at the same process geometry. The response surface modeling scheme is used to obtain interpolated values of the moments.

Each marginal distribution is fitted to the Generalized Lambda Distribution (GLD). In this example, the fitting is performed using FMKL parameterization, which is described in terms of its quantile function and is parameterized by a four element vector $\lambda$. It will be appreciated that other methods of fitting may be used as an alternative to FMKL parameterization. The FMKL GLD quantile function is given as:

$$Q(p) = \lambda_1 + \frac{1}{\lambda_2}\left(\frac{p^{\lambda_3}-1}{\lambda_3} - \frac{(1-p)^{\lambda_4}-1}{\lambda_4}\right)$$

The distribution function is obtained by numerically inverting the quantile function and the density function via the composition of the distribution function with the quantile density function (the derivative of the quantile function).

At step 622, the method of moments is employed to obtain values for $\lambda$ that reproduce the target distribution. This is repeated for each of the marginal distributions of the compact model parameters, resulting at step 624 in a $4 \times n_p$ matrix of $\lambda$ values, being stored in computer memory. This process is repeated for each of the selected process geometries.

To generate random variates, Gaussian distributed random numbers are generated and then the Probability Integral Transform is applied to obtain a random sample that follows the expected target distribution. The Probability Integral Transform is defined such that:

$$U = F_X(X)$$

$$Y = F_Y^{-1}(U)$$

where $F_X$ is the distribution function of X, in this case a Gaussian; U is a uniformly distributed random variable; $F_Y^{-1}$ is the quantile function of the target marginal distribution, in this case a GLD fitted to the target data; and Y is a random variable following the target marginal distribution.

But first, in order to complete the description of the multivariate distribution of the compact model parameters, the correlation matrix is used, which is obtained using the following two step process. First, at step 626, the expected correlation matrix is calculated for the target data at each selected process geometry. Then, due to the fact that the Pearson Product-Moment Correlation is not invariant under the Probability Integral Transform, correlation is determined that, when the Probability Integral Transform is applied to the initial bivariate Gaussian, results in the desired correlation between the two parameters in question. These values are obtained at step 628 using numerical root finding, using the target correlation as an initial guess. Following this, at step 630, a so-called inter-correlation matrix is obtained that represents the "untransformed" relationship between the parameters. There is an inter-correlation matrix for each of the selected coordinates in process space (e.g. process geometry), and this completes the description of the multivariate distribution of the parameters.

To generate parameter instances that follow the specified probability laws, we select the appropriate coordinates in process space. At step 632, Gaussian distributed random numbers are generated. Then, at step 634, a multivariate Gaussian variate is generated with the inter-correlation determined by the selected coordinates in process space. At step 636, the Probability Integral Transform is applied, with the multivariate Gaussian variates and matrix of $\lambda$ values as inputs, yielding random variates 638 stored in computer memory that are distributed according to the target distribution. The random variates are then used as model cards input to SPICE simulation. SPICE simulation is performed integrated and circuits are fabricated with designs based on the SPICE simulation.

The examples described herein provides a compact modeling methodology that fully captures the effects of process-induced variation as obtained from physical 3-D TCAD simulations. The examples allow for highly accurate compact models to be generated that correspond to arbitrary process-induced circuit variations, even those that were not part of the input ensemble for the model generation process.

Figure 7:
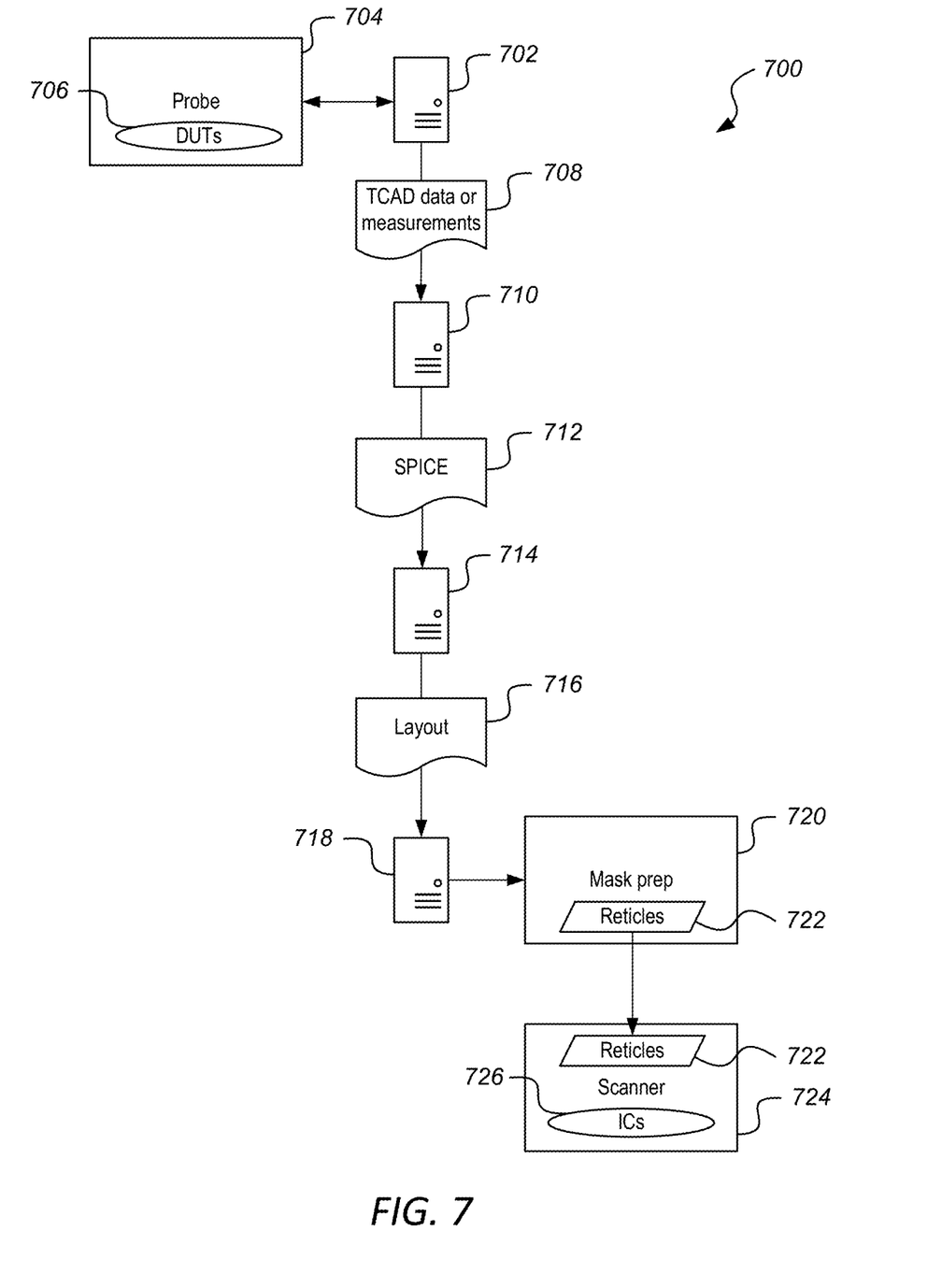
FIG. 7 shows a measurement, simulation and fabrication system for manufacturing integrated circuits in accordance with at least one embodiment of the present invention.

FIG. 7 shows a measurement, simulation and fabrication system for manufacturing integrated circuits in accordance with at least one embodiment of the present invention. The system 700 has measurement at the left, simulation and design in the middle and fabrication at the right. Computer 702, which may control probe system 704, obtains a set of measured data from one or more substrate (typically a semiconductor wafer) under test 706. The substrate under test 706 includes physical semiconductor devices under test (DUTs). As described below, the set of measured data is utilized by at least one processor of at least one computer of the system to implement a method for generating semiconductor device model parameters, as described with reference to FIG. 3 to FIG. 6.

The computer 702 acquires device measurement results and may perform the TCAD simulations, as described with reference to step 302 in FIG. 3 and outputs TCAD simulation results or measurement results 708. These are received by the computer 710 on which extraction and parameter generation are performed, as described with steps 304 to 308 with reference to FIG. 3.

The semiconductor device model (SPICE) parameters 712 thus generated by computer 710 are received by computer 714. Computer 714 uses the generated semiconductor device model parameters in a SPICE simulation as part of the IC design flow. The design process ultimately generates a mask layout 716.

Another computer 718 is used to control a mask-preparation tool 720 using the mask layout 716 to make a set of reticles 722. The reticles 722 are used in a lithography tool, such as a scanner, 724 to pattern a semiconductor substrate 726 to produce integrated circuits on the substrate.

Due to the improved accuracy of the invention's method of generating semiconductor device model parameters as described above, the design and/or fabrication of physical semiconductor devices can be significantly improved. In other words, results obtained from the invention's improved generation of semiconductor device model parameters can be utilized to aid engineers in significantly improving the design and/or fabrication of semiconductor circuits and production dies, resulting in an increase in production yield.

It is apparent to one of ordinary skill in the art that the innovative method of the present invention for statistical semiconductor device modeling is, at least in some embodiments, implemented by a computer programmed with code to carry on various steps of the present invention's method as described above. Moreover, the code necessary to program such computer can of course be stored in and/or read from any computer-readable medium, such as a compact disk (CD), a digital video disk (DVD), a flash memory storage device, a hard disk, a random access memory (RAM), or a read only memory (ROM), as well as numerous other computer-readable media not specifically mentioned in this application.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a method for generating semiconductor device model parameters has been described.

The invention claimed is:

1. A method for execution in at least one processor of at least one computer, the method for generating semiconductor device model parameters, the method comprising:
   (a) receiving semiconductor device performance data of a plurality ($n_s$) of statistical instances of semiconductor devices, for a plurality ($n^m$) of coordinates in a process space, wherein at least some of the semiconductor device performance data is obtained, at least in part, from a data set acquired by measurement, wherein each coordinate in the process space is defined by a Cartesian product of n process-dependent device parameters capable of m identified values;
   (b) extracting $n_P$ model parameters from the semiconductor device performance data to produce a plurality ($n_P*n_s$) of individual model instances each corresponding to the respective statistical instances for the plurality ($n^m$) of coordinates in the process space, thereby providing $n_P \times n_s \times n^m$ values that can be represented in a 3-D matrix and that characterizes a response of a subject transistor to time-dependent degradation;
   (c) modeling statistics of the extracted model parameters by processing the individual model instances to determine, for each coordinate in the process space:
      moments describing non-normal marginal distributions of the extracted model parameters; and
      correlations between the extracted model parameters;
   (d) generating semiconductor device model parameters using the moments determined and the correlations determined, for a selected coordinate in the process space; and
   (e) using the semiconductor device model parameters generated to simulate a circuit to be fabricated with a design based on simulation.

2. The method of claim 1, wherein the process space has dimensions of the process-dependent device parameters.

3. The method of claim 1, wherein differences between the statistical instances relate to different modelled configurations of device geometry, which affect semiconductor device performance.

4. The method of claim 1, wherein receiving semiconductor device performance data further comprises:
   obtaining uniform semiconductor device performance data of a uniform semiconductor device that is a basis around which variations occur, and
   wherein extracting model parameters comprises:
      extracting from the uniform semiconductor device performance data a set of uniform model parameters and using the uniform model parameters to re-extract from the semiconductor device performance data a subset of the uniform model parameters for each of the statistical instances, and wherein the subset model parameters being selected to capture process-induced variability of semiconductor device performance that arises from variation of the semiconductor device.

5. The method of claim 1, wherein modeling statistics comprises using response surface modeling to calculate moments and correlations at combinations of intermediate process-dependent device parameters.

6. The method of claim 1, wherein modeling statistics further comprises calculating Generalized Lambda Distribution (GLD) parameters to fit the moments by fitting each determined marginal distribution to a Generalized Lambda Distribution (GLD) using method of moments.

7. The method of claim 1, wherein generating model parameters comprises generating multivariate Gaussian variates and applying a Probability Integral Transform to obtain a random sample of variates as the semiconductor device model parameters.

8. The method of claim 1, wherein the model generated corresponds to circuits of arbitrary circuit ages.

9. The method of claim 8, wherein the model generated includes at least one circuit having a circuit age not included in the semiconductor device performance data as received.

10. The method of claim 1, wherein determining, for each coordinate in the process space, moments describing non-normal marginal distributions of the extracted model parameters includes: obtaining for each fixed coordinate in the process space in the plurality ($n^m$) of coordinates in the process space, an $n_P \times n_s$ matrix of parameters.

11. The method of claim 10, further including determining from the $n_P \times n_s$ matrix of parameters, a marginal distribution of each model parameter.

12. The method of claim 10, further including determining from the $n_P \times n_s$ matrix of parameters, a plurality of $n^m$ correlation matrices.

13. The method of claim 10, further including determining for each coordinate in the process space in a 3D matrix, moments describing a plurality ($n^m * n_P$) marginal distributions and $n^m$ correlation matrices.

14. A system for generating semiconductor device model parameters, the system obtaining a set of measured data from a substrate under test, the substrate under test including a physical semiconductor device, the set of measured data being utilized by at least one processor of at least one computer of the system to implement a method for generating semiconductor device model parameters, the computer configured to perform:
(a) receiving semiconductor device performance data of a plurality ($n_s$) of statistical instances of semiconductor devices, for a plurality ($n^m$) of coordinates in a process space, wherein at least some of the semiconductor device performance data is obtained, at least in part, from the set of measured data, wherein each coordinate in the process space is defined by a Cartesian product of n process-dependent device parameters capable of m identified values;
(b) extracting $n_P$ model parameters from the semiconductor device performance data to produce a plurality ($n_P * n_s$) of individual model instances each corresponding to the respective statistical instances for the plurality ($n^m$) of coordinates in the process space, thereby providing $n_P \times n \times n^m$ values that can be represented in a 3-D matrix and that characterizes a response of a subject transistor to time-dependent degradation;
(c) modeling by computer statistics of the extracted model parameters by processing the individual model instances to determine, for each coordinate in the process space:
moments describing non-normal marginal distributions of the extracted model parameters; and
correlations between the extracted model parameters;
(d) generating semiconductor device model parameters using the moments determined and the correlations determined, for a selected coordinate in the process space; and
(e) using the semiconductor device model parameters generated to simulate a circuit to be fabricated with a design based on simulation.

15. A method of manufacturing integrated circuits, the method comprising:
(a) receiving semiconductor device performance data of a plurality ($n_s$) of statistical instances of semiconductor devices, for a plurality ($n^m$) of coordinates in process space, wherein at least some of the semiconductor device performance data is obtained, at least in part, from a data set acquired by measurement, wherein each coordinate in the process space is defined by a Cartesian product of process-dependent device parameters capable of m identified values;
(b) extracting $n_P$ model parameters from the semiconductor device performance data to produce a plurality ($n_P * n_s$) of individual model instances each corresponding to the respective statistical instances for the plurality ($n^m$) of coordinates in the process space, thereby providing $n_P \times n \times n^m$ values that can be represented in a 3-D matrix and that characterizes a response of a subject transistor to time-dependent degradation;
(c) modeling statistics of the extracted model parameters by processing the individual model instances to determine, for each coordinate in the process space:
moments describing non-normal marginal distributions of the extracted model parameters and
correlations between the extracted model parameters;
(d) generating semiconductor device model parameters using the moments determined and the correlations determined, for a selected coordinate in the process space;
(e) using the generated semiconductor device model parameters to generate a mask layout; and
(f) using the mask layout to pattern a semiconductor substrate to produce an integrated circuit.

16. A non-transitory computer-readable medium containing program code, the program code adapted to configure at least one processor to perform:
(a) receiving semiconductor device performance data of a plurality ($n_s$) of statistical instances of semiconductor devices, for a plurality ($n^m$) of coordinates in a process space, wherein at least some of the semiconductor device performance data is obtained, at least in part, from a data set acquired by measurement, wherein each coordinate in the process space is defined by a Cartesian product of n process-dependent device parameters capable of m identified values;
(b) extracting $n_P$ model parameters from the semiconductor device performance data to produce a plurality ($n_P * n_s$) of individual model instances each corresponding to the respective statistical instances for the plurality ($n^m$) of coordinates in the process space, thereby providing $n_P \times n_s \times n^m$ values that can be represented in a 3-D matrix and that characterizes a response of a subject transistor to time-dependent degradation;

(c) modeling statistics of the extracted model parameters by processing the individual model instances to determine, for each coordinate in the process space:
moments describing non-normal marginal distributions of the extracted model parameters; and
correlations between the extracted model parameters;

(d) generating semiconductor device model parameters using the moments determined and the correlations determined, for a selected coordinate in the process space; and (e) using the semiconductor device model parameters generated to simulate a circuit to be fabricated with a design based on simulation.

17. The non-transitory computer-readable medium of claim 16, wherein the computer-readable medium being selected from the group consisting of a compact disk (CD), a digital video disk (DVD), a flash memory storage device, a hard disk, a random access memory (RAM), and a read only memory (ROM).

* * * * *